United States Patent [19]

Bauer et al.

[11] Patent Number: 4,545,115

[45] Date of Patent: Oct. 8, 1985

[54] METHOD AND APPARATUS FOR MAKING OHMIC AND/OR SCHOTTKY BARRIER CONTACTS TO SEMICONDUCTOR SUBSTRATES

[75] Inventors: Hans J. Bauer, Boeblingen; Bernd Garben, Schonaich, both of Fed. Rep. of Germany

[73] Assignee: International Business Machines Corporation, Armonk, N.Y.

[21] Appl. No.: 565,080

[22] Filed: Dec. 23, 1983

[30] Foreign Application Priority Data

Feb. 4, 1983 [EP] European Pat. Off. ...... 81 101 059.0

[51] Int. Cl.$^4$ ............................................. H01L 21/28
[52] U.S. Cl. ....................................... 29/590; 148/174; 148/DIG. 19; 148/DIG. 158; 148/DIG. 22
[58] Field of Search ........................... 29/590; 148/174; 204/192 C; 427/84, 88, 91, 93, 250

[56] References Cited

U.S. PATENT DOCUMENTS

| | | | |
|---|---|---|---|
| 3,274,679 | 9/1966 | Lepselter | 29/155.5 |
| 3,290,127 | 12/1966 | Kahng et al. | 29/195 |
| 3,645,812 | 2/1972 | Sussmann | 148/175 |
| 3,893,160 | 7/1975 | Botzenhardt | 357/71 |
| 3,906,540 | 9/1975 | Hollins | 357/15 |
| 3,995,301 | 11/1976 | Magdo | 357/15 |
| 4,004,044 | 1/1977 | Franco et al. | 427/43 |
| 4,215,156 | 7/1980 | Dalal et al. | 427/84 |

FOREIGN PATENT DOCUMENTS

| | | |
|---|---|---|
| 1201743 | 8/1970 | Fed. Rep. of Germany ... 204/192 C |
| 2702282 | 7/1978 | Fed. Rep. of Germany . |
| 2758576 | 7/1979 | Fed. Rep. of Germany . |

OTHER PUBLICATIONS

Mets, "Poisoning and Gettering Effects in Si Junctions", J. of Electrochem. Soc., vol. 112, No. 4, Apr. 65.
Andersson et al., "3.5 Morphologies of rf Sputter-Deposited Solid Lubricants", Vacuum vol. 27, No. 4.
Gates, "Gettering Process of Wafer Deffects Reduction", IBM Techn. Discl. Bull., vol. 15, No. 6, Nov. '72.
IBM Technical Disclosure Bulletin, vol. 21, No. 3, Aug. 1978, "Oxygen Gettering in Transition Metals for Stable Low Barrier Height Schottky Diodes", by W-K. Chu et al., pp. 1054–1057.
IBM Technical Disclosure Bulletin, vol. 13, No. 3, Aug. 1970, "Fabricating a Gate Field-Effect Transistor", pp. 646–648, by C. J. Kitcher et al.
Journal of the Electrochemical Society, vol. 122, No. 7, Jul. 1975, "Microstructural and Electrical Properties of Thin PtSi Films and Their Relationships to Deposition Parameters", pp. 1337–1347, by R. M. Anderson et al.

Primary Examiner—Brian E. Hearn
Assistant Examiner—Hunter L. Auyang
Attorney, Agent, or Firm—T. Rao Coca

[57] ABSTRACT

Disclosed is a method of making ohmic and/or Schottky barrier contacts to a silicon semiconductor substrate in which before depositing the metal on silicon semiconductor substrates containing integrated circuits which are covered by a mask having contact windows, the metal is initially deposited on freshly cleaned blank silicon semiconductor substrates mounted in the same vacuum chamber. In this manner any traces of oxygen present in the vacuum chamber are chemisorbed by the blank substrate resulting in deposition of a high quality oxide-free metal contacts on the device substrates.

The disclosed apparatus comprises a deposition chamber maintained at a predetermined low pressure, a substrate holder carrying a plurality of blank silicon substrates and silicon substrates containing integrated circuit structures covered by a mask having contact windows, a source of metal placed in the chamber for evaporation or sputtering and a shutter arranged in close proximity with said substrate holder for shielding selected substrates during the initial stages of metal deposition.

12 Claims, 7 Drawing Figures

METHOD AND APPARATUS FOR MAKING OHMIC AND/OR SCHOTTKY BARRIER CONTACTS TO SEMICONDUCTOR SUBSTRATES

BACKGROUND OF THE INVENTION

1. Field of the Invention

The invention relates to a method of making ohmic and/or Schottky barrier diode contacts to a semiconductor substrate, more particularly, to a method of making oxide-free contacts and to an apparatus for implementing the method.

2. Description of the Prior Art

The requirements for a material or combination of materials to provide ohmic and Schottky barrier diode contacts to semiconductor substrates are extremely high both from an electrical and chemical standpoint.

Numerous metallurgical systems which are known to semiconductor designers have been proposed and utilized as ohmic and Schottky barrier diode contacts. The single most successful metal used in interconnections of integrated circuits is aluminum or aluminum doped with a small amount of copper or silicon. Aluminum makes good ohmic and mechanical contact to the silicon and to the surrounding insulating layers. It is easy to deposit by standard evaporation or sputtering techniques and can be easily patterned by etching or similar techniques. However, aluminum has a tendency to interact with silicon, particularly at high temperature processing, causing short circuits between the aluminum and the semiconductor substrate. In addition, aluminum alone forms neither a very high, nor a low, barrier height Schottky barrier contact to silicon.

Another metallurgical system that has been suggested for utilization as ohmic and Schottky barrier contacts to silicon semiconductor substrates is a metal-silicon compound known as a silicide. In this connection silicides such as platinum silicide, palladium silicide, nickel silicide, rhodium silicide, zirconium silicide, hafnium silicide, have been proposed. A prior art reference in this context is IBM Technical Disclosure Bulletin, Vol. 13, No. 3, August 1970, pp. 646–648, C. I. Kirchner and H. N. Yu, "Fabricating a Gate Field-Effect Transistor".

Reference is made to U.S. Pat. No. 3,274,670 which discloses a method of forming low-resistance electrical contacts to semiconductor devices by depositing on a silicon substrate a thin layer of platinum and heat treating to form platinum silicide. Thereafter, a composite layer of platinum, titanium and gold is deposited over the platinum silicide.

Reference is made to U.S. Pat. No. 3,290,127 which discloses forming an active contact layer of palladium silicide as a surface barrier with the semiconductor material. Silver-gold metallization is then formed over the contact layer. According to this patent other suitable metals in place of palladium include nickel, copper, rhodium, platinum, tungsten, molybdenum.

U.S. Pat. No. 3,893,160 discloses a resistive connecting contact for a silicon semiconductor substrate formed from a layer sequence of platinum silicide-titanium-molybdenum-gold.

Referring to the prior art on Schottky barrier diode contacts, it is known, for example, from U.S. Pat. No. 3,906,540 to form on the surface of a silicon semiconductor body a layer of a metal silicide such as platinum silicide, then applying a refractory metal barrier layer such as molybdenum, titanium, tungsten, tantalum, followed by forming an aluminum contact layer. The refractory metal barrier layer prevents intra-diffusion of aluminum and silicon constituents during subsequent heat treatments.

From U.S. Pat. No. 3,995,301 a Schottky barrier structure is known where a metal layer of $Al_2Pt$ is in contact with a high resistivity semiconductor region. The structure is fabricated by first forming a platinum silicide layer on a silicon substrate and then applying an aluminum layer thereon after which the structure is sintered at a temperature of at least 400° C. for at least one hour.

Thus, the literature is replete with a multitude of metallurgical systems which fulfill one or more functions as metallurgical contacts. One of the most successful of these systems for ohmic contacts is platinum silicide/aluminum and for Schottky barrier contacts is a system which utilizes a barrier layer consisting of chromium, titanium, tungsten or a titanium-tungsten alloy between aluminum and the silicide layer.

The above discussed metals which are known for their suitability for contact metallization are usually applied on carefully cleaned silicon semiconductor substrates provided with a mask layer having the desired contact openings, typically, by electron beam evaporation or cathode sputtering techniques in a high vacuum at temperatures higher than approximately 350° C. These methods of application in a high vacuum present a number of problems which hitherto could not be solved satisfactorily. For example, in the production of platinum silicide semiconductor contacts by evaporation of platinum in a high vacuum at a temperature of approximately 350° C. and subsequent sintering, forming of platinum silicide in the contact region is impeded by the presence of a thin surface layer of silicon which is rich in oxygen. This oxygen-rich layer, which can be detected by means of Auger-electron spectroscopy, causes a deterioration of the electrical contact properties. Schottky barrier diodes fabricated in this manner exhibit a high contact resistance and a non-linear behavior. Also, during the cleaning of the contacts prior to the evaporation of the aluminum metallization it was even possible to completely remove the platinum silicide due to etching of the underlying oxygen-rich layer. The application of other metals for the contacting of semiconductor substrates revealed similar phenomena.

It is believed that the oxygen-rich layer is a layer of silicon dioxide which grows in the exposed contact regions of the silicon substrate during the above-mentioned 350° C. process step, due to the presence of oxygen and steam residues in the vacuum chamber. Consequently, to improve the contact behavior attempts were made to reduce the oxygen content in the vacuum chamber. One approach is to improve the vacuum in the evaporation by installing a Meissner trap and a cryopump. However, the long cooling and heating cycle of the Meissner trap reduces the throughput.

Another approach is to reduce the substrate temperature during the deposition of the platinum layer. The disadvantage of this method, however, is poor adhesion of the platinum silicide film to the silicon semiconductor substrate resulting in poor electrical contact properties. Attempts were also made to initially deposit the platinum film on cold silicon wafers and as the deposition progressed heat the wafers to a temperature of approximately 350° C. The disadvantage of this method is that it is difficult to control and therefore not suitable for manufacturing purposes.

The cleaning of the substrate surface by means of high frequency cathode sputtering in a vacuum chamber prior to the deposition of a metallic film has been described in the literature (e.g., see the article by R. M. Anderson and T. M. Reith in *J. Elec. Chem. Soc.*, Vol. 122, 1337, 1975). This method although leads to a cleaning of the substrate surface, due to resputtering during cleaning metallic impurities such as iron and nickel are deposited on the surface of the silicon wafers. In addition to forming metallic impurities, the cleaning technique does not fully remove the oxygen.

Reference is also made to German Offenlegungsschrift No. 2,758,576 which concerns a high temperature method for reducing traces of undesired heavy metals such as nickel, copper, iron and gold which entered the doped semiconductor wafer during fabrication of silicon semiconductor devices. In this method one or more doped semiconductor wafers are arranged along the longitudinal axis of a sealed quartz tube and flanked on either side by high purity unprocessed silicon semiconductor wafers. The undesired traces of heavy metals are removed by maintaining in the quartz tube an inert gas atmosphere at a pressure of approximately $1 \times 10^{-6}$ torr and temperature of 1100° C. for a period of at least 10–60 minutes.

SUMMARY OF THE INVENTION

It is therefore an object of the invention to provide an improved method of making ohmic and/or Schottky barrier contacts to semiconductor substrates.

Another object of the invention is to provide a method for making oxide-free ohmic and Schottky barrier contacts to semiconductor substrates.

It is still another object of the invention to provide a method of making ohmic and/or Schottky barrier metal or metal silicide contacts to semiconductor substrates by reducing the oxygen content in the high vacuum system utilized for depositing the metal.

These and other objects of the invention are achieved by a novel method of forming ohmic and/or Schottky barrier contacts to a silicon semiconductor substrate in which before depositing the metal, typically, by utilizing a high vacuum deposition system maintained at a temperature of about 350° C., on a substrate having various integrated circuit structures which are covered with a suitable mask having contact windows (device substrate), the metal is deposited on one or more clean, blank silicon substrates mounted in the same deposition system. Due to chemisorption, any traces of oxygen present in the deposition chamber are removed by the blank substrates. Thereafter, the metal is deposited on the device substrate forming the metal contacts in the exposed areas of the device substrate. Since the oxygen has been effectively removed from the deposition chamber before depositing the contact metal, no oxidation of the device substrate occurs during the metal deposition and the contacts to the device substrate are free of oxide.

The apparatus in accordance with the invention is a deposition system having a high vacuum deposition chamber suitable for evaporation or sputtering of a source of metal placed therein. Arranged inside the deposition chamber is a rotatable substrate holder carrying a plurality of freshly cleaned blank silicon substrates and silicon substrates having integrated circuit devices with contact windows formed thereon. Adjacent the substrate holder are provided a combination of heating elements and reflectors for uniformly heating the substrates to a desired temperature. The chamber is fitted, in close proximity with the substrate holder, a rotatable shutter for shielding selected substrates from metal deposition. Another rotatable shutter, arranged in close proximity with the metal source, controls not only the initiation and termination but also the rate of metal deposition on the substrates.

In operation, the substrates having the integrated circuits are arranged such that they are initially shielded by the substrate shield. After establishing the desired temperature and pressure inside the chamber the metal is deposited exclusively on the blank substrates for a short period of time, about 30 seconds. During this step, any traces of oxygen present in the chamber will be chemisorbed by the blank substrates leaving the chamber oxygen-free. Thereafter, the substrates having the integrated circuits are exposed by removing the substrate shield and the metal is deposited in the contact windows therein.

The method of the invention can be advantageously used for making Schottky barrier diodes with low barrier height taught in U.S. Pat. No. 4,215,156 which is assigned to the present assignee. In this method the contact metal is tantalum which is deposited using an evaporator at a low pressure on the opened contact windows of a silicon substrate maintained at a low temperature. Consistently excellent electrical properties can be obtained if prior to depositing the tantalum in the contact windows it is deposited on freshly etched blank silicon semiconductor substrates mounted in the same evaporation system as discussed hereinabove.

The invention will now be described in detail with reference to the attached drawings which illustrate a preferred embodiment.

DETAILED DESCRIPTION

Figure 2:
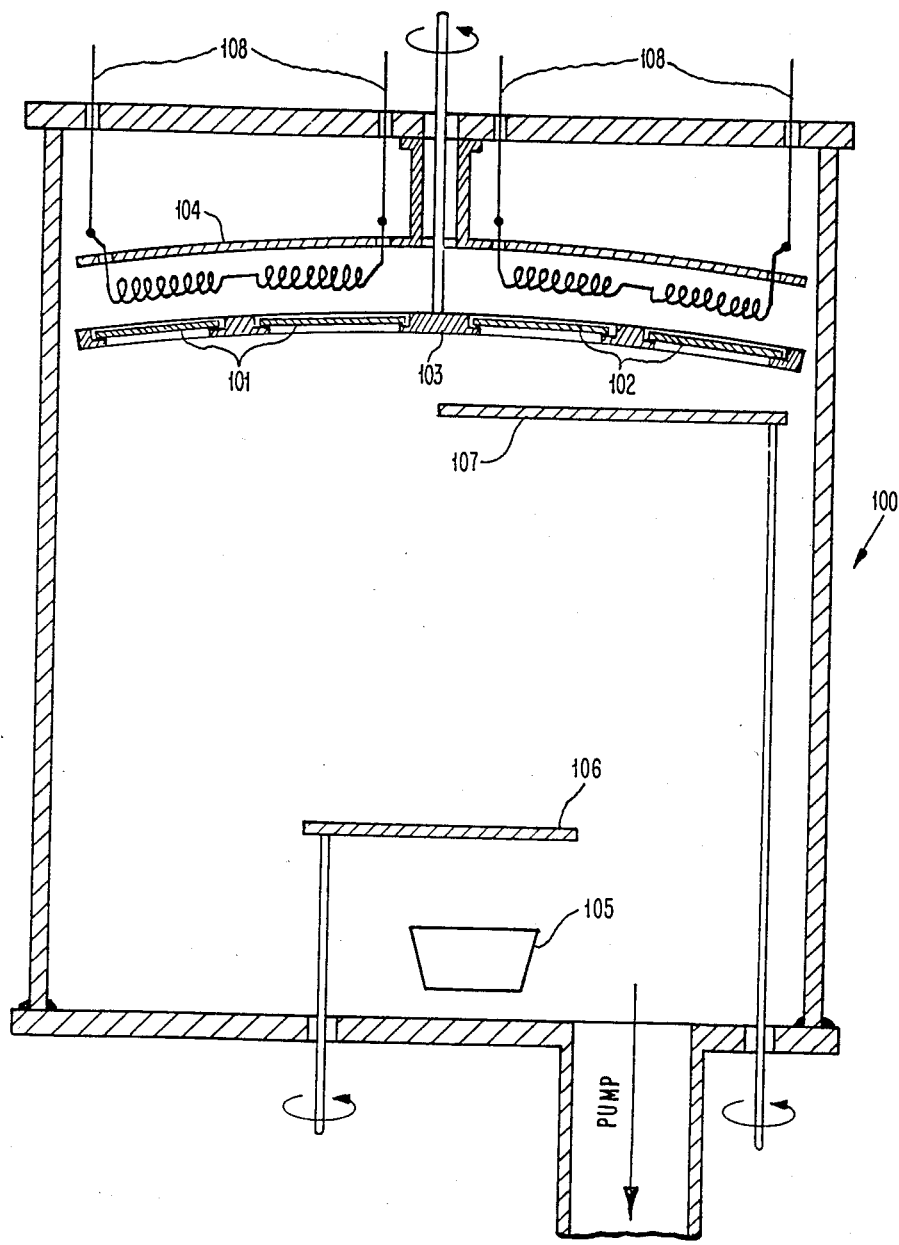
FIG. 2 is a novel apparatus for making oxide-free ohmic or Schottky barrier contacts on a semiconductor substrate.

Oxide-free metal or metal silicide contacts to silicon substrates in accordance with the invention are formed by utilizing the novel apparatus schematically illustrated in FIG. 2. The apparatus consists of a deposition chamber 100 which is connected to a vacuum pump (not shown) for maintaining a uniform high vacuum therein. Inside chamber 100 is mounted near the ceiling thereof, in a rotatable arrangement, a substrate holder 103 for holding a plurality of substrates 101 and 102. Substrates 101, for example, are freshly cleaned blank silicon semiconductor substrates and substrates 102 are silicon substrates containing integrated circuit devices and covered with a mask having contact windows. Above the substrate holder 103 are provided a plurality of heating elements 108 and a reflector 104 for uniformly heating the substrates 101 and 102 to a desired temperature in the range 330°–550° C.

A source 105 of a desired metal for deposition in the contact windows of substrates 102 is placed at the bottom of the deposition chamber. The metal source 105 is provided with a rotatable shutter 106 for not only setting the starting and end points of the metal evaporation, but also controlling the rate of metal deposition on the substrates.

The deposition chamber 100 is also provided, in close proximity with the substrate holder 103, a rotatable shutter 107 for effectively shielding substrates 102 during the initial stages of the metal deposition.

In operation, all the substrates mounted on the substrate holder 103 with the surface on which the metal is to be deposited facing down. The substrates are heated by means of the heating elements 108 in a high vacuum in the range $2.5 \times 10^{-6}$–$4 \times 10^{-7}$ torr to a desired substrate temperature in the range 330°–550° C. The shutter 107 is then arranged such that the device substrates 102 are effectively shielded during the initial stages of metal deposition. The metal 105 is then caused to evaporate and the evaporated metal is allowed to deposit on the blank substrates 101 by opening the shutter 106 for a period of about 30 seconds. During this short initial deposition step any oxygen present in chamber 100 is chemisorbed by the exposed blank substrates 101 thereby establishing an essentially oxygen-free high-vacuum environment therein. Thereafter, shutter 107 is opened and the metal is allowed to deposit on the device substrates 102 forming the metal contacts with these substrates in the areas corresponding to the contact windows. Since all traces of oxygen have been removed from the deposition chamber prior to depositing the contact metals on the device substrates, no silicon dioxide layer is formed in the contact areas and the resulting metal contacts are oxide-free.

Having described in detail the apparatus for forming oxide-free metal contacts, a detailed description of forming Schottky barrier diodes and ohmic contacts will now be provided.

Figure 1A:
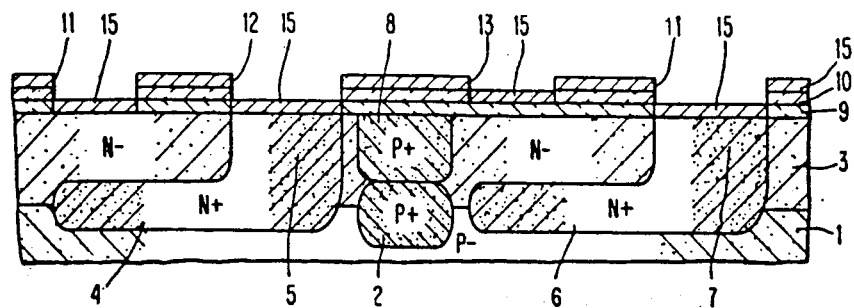
FIGS. 1A to 1F are fragmentary, sectional views of a semiconductor device incorporating the process of the invention during various stages of fabrication.

Referring to the drawings, FIG. 1A illustrates that portion of a semiconductor chip which is to contain ohmic contacts and Schottky barrier diodes made using the method of the invention. The semiconductor chip substrate 1 is illustrated as P-type silicon, for example, having a resistivity of 10 ohm-cm. Disposed on substrate 1 is an N⁻ epitaxial layer 3 which preferably exhibits a conductivity of $1 \times 10^{16}$ to $8 \times 10^{16}$ atoms/cm³. Buried within the structure are N+ regions 4 and 6 having associated therewith reachthrough regions 5 and 7, respectively. The substrate also contains P+ subisolation region 2 which, in association with P+ isolation region 8, separates the N+ regions from each other.

Regions 2, 4 and 6 are advantageously formed by the standard process of diffusing said regions into windows which expose portions of the bare substrate 1. Typical N+ impurities are arsenic and phosphorous; a typical P+ impurity is boron.

The masking layer is then stripped from substrate 1 by conventional etching techniques and layer 3 is grown epitaxially thereby causing regions 2, 4 and 6 out-diffuse into layer 3. A masking layer which is typically composed of a silicon dioxide layer 9 and a silicon nitride layer 10 is then formed on the surface of layer 3 and windows are made in this masking layer through which N+ and P+ impurities are diffused to form reachthrough regions 5 and 7 and isolation region 8, respectively.

The next step is deposition in blanket fashion a platinum layer 15 atop the silicon nitride layer 10 and within windows 11, 12, 13 and 14. This is accomplished by utilizing the apparatus shown in FIG. 2. The wafers are first pre-cleaned in an aqueous hydrofluoric acid solution (having a ratio of H₂O: HF in the range 15:1 to 5:1) and then placed on the substrate holder 103 in the deposition chamber 100 in the position corresponding to one of the two substrates 102 (FIG. 2). The substrates designated by numeral 101 in FIG. 2 are freshly cleaned silicon substrate blanks (i.e. unprocessed silicon semiconductor substrates having no integrated circuits). All silicon substrates in the substrate holder 103 are then heated in a high vacuum of $2.5 \times 10^{-6}$ torr by heating elements 108 to a desired substrate temperature, e.g. 350° C. Before depositing the platinum by evaporation or cathode sputtering the substrate containing integrated circuits 102 is masked from the platinum source 105 by shutter 107 so that at first platinum will deposit only on the blank silicon semiconductor substrates 101. During this pre-platinum deposition step, lasting for less than about 30 seconds, any oxygen remaining in the vacuum chamber is chemisorbed by the blank semiconductor substrates, resulting in a practically oxygen-free high vacuum environment in the deposition chamber 100. Subsequently, shutter 107 is opened and platinum is allowed to deposit on the silicon semiconductor substrate 102 until a layer thickness of approximately 400Å has been formed.

Referring to FIG. 1A silicon dioxide layer 9 in window 13 prevents the platinum in this window from contacting substrate 3.

Figure 1B:
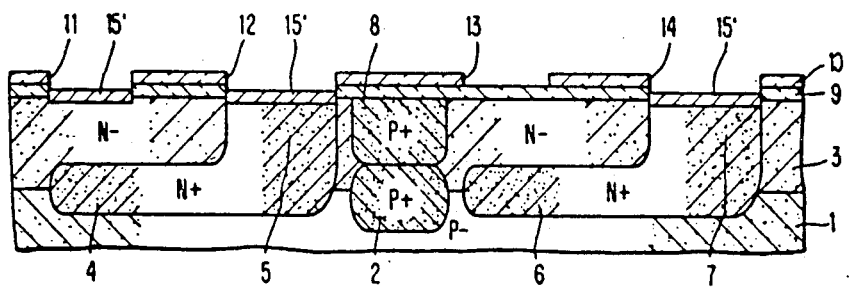

Referring to FIG. 1B, the wafer is then sintered at a temperature of 550° C. for approximately 20 minutes in a nitrogen ambient causing the platinum to react with the silicon to form platinum silicide 15' in windows 11, 12, and 14. The unreacted platinum, including that which is atop silicon dioxide layer 9, is then removed by etching in aqua regia. In the next step of the process as shown in FIG. 1C, the portion of silicon dioxide layer 9 which is deposited in window 13 is removed by standard wet or dry etching techniques to expose that portion of the substrate which is to constitute the anode of low-barrier-height Schottky barrier diode.

The deposition of a metallization system, e.g. of tantalum in windows 11 to 14 is carried out subsequently. The preferred process includes lift-off technique described in U.S. Pat. No. 4,004,044 which is assigned to IBM Corporation, the present assignee. This process is illustrated in abbreviated form in FIGS. 1D to 1F and will be described below. Alternative techniques for forming the metallurgy are standard wet or reactive ion (plasma) subtractive etching processes which are well known to those skilled in the art. However, the lift-off process is capable of providing superior definition of the metallurgy, thereby minimizing the area required for wiring.

Turning now to FIG. 1D the lift-off process commences with the blanket deposition of a thin layer of polyether sulfone 20 which facilitates the lift-off process. The use of polysulfone is a modification of the method disclosed in the aforementioned patent and has been described in the article by Carr et al in IBM Technical Disclosure Bulletin, Vol. 19, No. 4, September 1976, p. 1226. Disposed atop polyether sulfone layer 20 a layer 22 of an organic polymer material such as a novolak-resin-based positive photoresist which is baked at 210°–230° C. to render it non-photosensitive. Atop photoresist layer 22 is coated a barrier layer 24 consisting of a methylsiloxane resin followed by a layer 26 of a radiation sensitive resist.

Figure 1C:
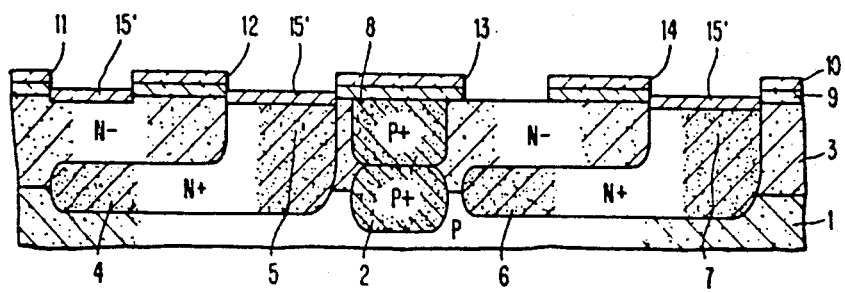
Figure 1:
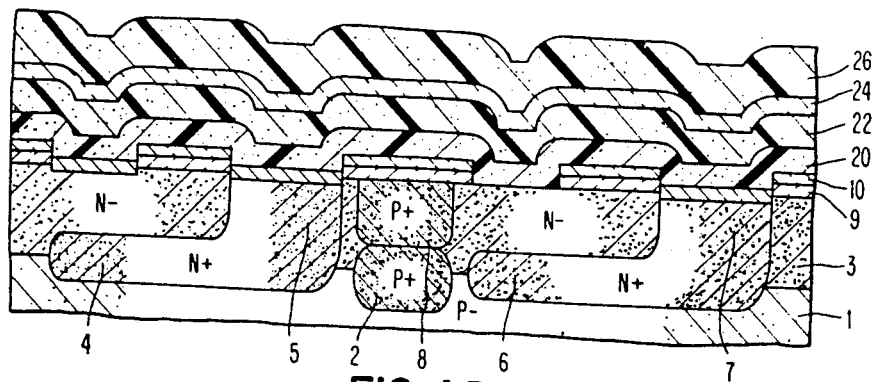
Figure 1:
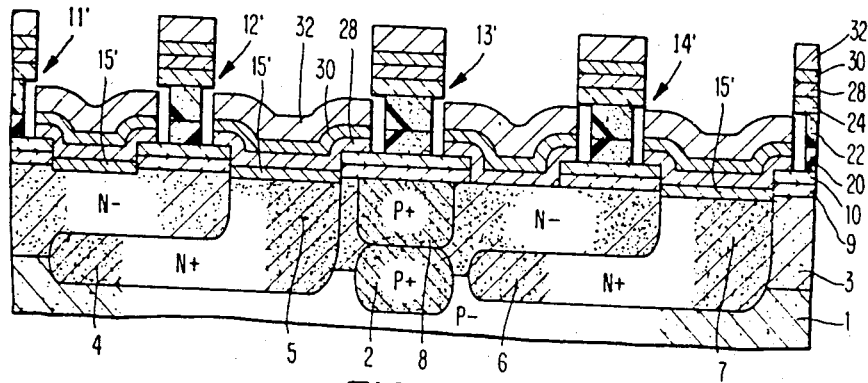
Figure 1:
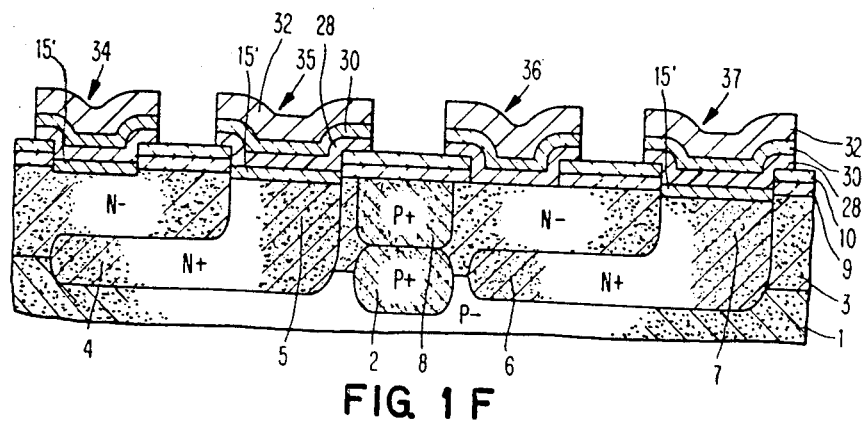

Layer 26 is then subjected to radiation and is developed to provide a patterned relief image corresponding to windows 11, 12, 13 and 14 of FIG. 1C. Photoresist mask 26 is then used to permit selective removal of the underlying layers 20, 22 and 24 to expose windows 11', 12', 13' and 14' illustrated in FIG. 1E, which correspond to the windows illustrated in FIG. 1C.

After the windows are formed, the exposed substrate, including the platinum silicide layer 15', is precleaned in a 15:1, or lower, ratio of water to hydrofluoric acid etchant solution under controlled radiation conditions disclosed fully in U.S. Pat. No. 4,215,216 which is assigned to the present assignee. A ratio of 5:1 is most advantageous. This surface preparation step is a requirement to achieve a low-barrier height (i.e. around 0.5 eV) Schottky barrier diode.

Attempts have made to clean the semiconductor surface by the technique of in-situ sputter cleaning in a sputtering chamber. This method did yield a barrier height of approximately 0.5 eV but the barrier height was not repeatable from run to run.

Returning to FIG. 1E, a metallization layer 28 is blanket deposited atop the substrate and the lift-off mask. In the present embodiment tantalum is used. To achieve a low-barrier-height Schottky barrier contact, the tantalum deposition process also must conform to an exacting procedure. The deposition is best accomplished with an E-beam evaporation source using the same deposition system used for the deposition of the platinum layer 15 discussed above in connection with FIG. 1A. The maximum pressure in the evaporation chamber during the process is approximately $2.5 \times 10^{-6}$ torr, with the initial pressure in the chamber being less than approximately $4 \times 10^{-7}$ torr. The maximum temperature of the substrate is 200° C. The importance of the pressure lies in the amount of moisture, hydrocarbons and other gaseous contaminants present in the chamber. The higher the pressure, the greater the moisture and contaminants which cause tantalum layer to oxidize slightly, resulting in a barrier height of greater than 0.5 eVolt.

In spite of the stringent vacuum requirements during tantalum deposition process a sufficient constancy of the electrical properties of the Schottky barrier diode was not guaranteed and occasional yield loss was inevitable. The reproducibility of the electrical properties, however, can be considerably improved if prior to depositing the tantalum on the silicon semiconductor substrates containing integrated circuit structures tantalum is deposited on blank silicon semiconductor substrates. This is accomplished utilizing the apparatus shown in FIG. 2 wherein the metal source 105 is tantalum, substrates 101 correspond to blank silicon substrates and either of the two substrates 102 correspond to the substrate under consideration. During the initial stages of tantalum evaporation, using shutter 107 the semiconductor substrate 102 containing integrated circuit structure under consideration is shielded. After all traces of oxygen have been removed from the deposition chamber shutter 107 is opened and tantalum is deposited on substrate 102. The evaporation which is executed at a rate of approximately 2Å per second is continued until a layer thickness of 600±150Å has been reached. The tantalum deposition of the semiconductor substrates can be carried out by means of electron beam evaporation or under the same pressure and temperature conditions by means of high frequency sputtering. The tantalum which is formed using this method is body-centered-cubic.

Following the deposition of tantalum layer 28, layer 30 of chromium and layer 32 of aluminum or copper-doped aluminum or copper-doped aluminum-silicon are deposited, preferably in the same evaporation chamber 100 (FIG. 2).

The chrome is deposited to a preferred thickness of between 600Å and 1000Å. Water vapor must be bled into the chamber during the evaporation. The substrate is held at a maximum temperature of 160° C. The chromium which is deposited with water vapor being bled into the chamber acts as an effective barrier layer between aluminum and tantalum.

The aluminum is advantageously deposited to a thickness of approximately 8500–10,000Å. Aluminum doped with a small amount of copper is preferable to pure aluminum. The resultant intermediate structure thereby achieved is illustrated in FIG. 1E.

The remaining lift-off structure 20-22-24 and overlying metal layers 28, 30 and 32 are quickly lifted off using N-methylpyrrolidone or another suitable solvent to leave a pattern of metal adhered to the surface of the substrate or oxide layer 10 as shown in FIG. 1F.

Next, the structure is sintered at 400° C. for approximately 1 hour and then resintered for another 2 hours at 450° C. This sintering is necessary to achieve a Schottky barrier diode barrier height of 0.5 eV.

This completes the basic process and leaves both high-barrier height and low barrier height Schottky barrier diodes. The anode and cathode of the high-barrier height Schottky barrier diode are identified in FIG. 1F by the reference numerals 34 and 35, respectively. The anode and cathode of the low-barrier-height Schottky barrier diode are identified by the reference numerals 36 and 37, respectively. Thus, using the same metallurgy (tantalum) three different types of contacts were fashioned. The cathodes 35 and 37 of both diodes are ohmic contacts to N+ regions 5 and 7 in layer 3. The anode 34 of the high-barrier height Schottky barrier diode uses the chromium-tantalum metallurgy between the platinum silicide 15 and the aluminum 32, the chromium layer 30 acting as a diffusion barrier. Platinum silicide 15' yields an increased barrier height as compared to anode 36 of the low-barrier-height Schottky barrier diode, where no platinum silicide is present. In region 36 the tantalum 28 itself directly contacts the N-conductive silicon substrate 3.

In practice, the tantalum is not necessary in forming the high-barrier height Schottky barrier diode. A contact comprising aluminum, chrome and platinum silicide is perfectly satisfactory. However, it is more practical in a manufacturing environment to deposit the tantalum in blanket fashion within all contact openings.

While the invention has been particularly shown and described with reference to a preferred embodiment thereof, it will be understood by those skilled in the art that changes in form and detail may be made therein without departing from the spirit and scope of the invention.

For exaample, although the invention has been described with particular reference to an integrated circuit structure wherein ohmic contacts and high- and low-barrier Schottky barrier contacts are made, it is not necessary to fabricate all such contacts to be within the purview of the invention.

What is claimed is:

1. A low temperature method for fabricating a silicon dioxide-free conductive contact on a semiconductor substrate having integrated circuit devices thereon, said method comprising:

(a) placing a semiconductor substrate having integrated circuit devices (device substrate) and atleast one clean, blank silicon substrate in a deposition chamber maintained at a predetermined low pressure;

(b) heating said substrates to a low temperature in the range of 330° C. to 550° C.;

(c) shielding said device substrate by means of a shutter arranged in close proximity to said device substrate;

(d) depositing a conductive metal on said atleast one blank substrate at said low temperature and pressure for a short period of time to remove any trace of oxygen in said chamber by chemisorption of said oxygen by said atleast one blank substrate and thereby establishing an oxygen-free environment in said chamber;

(e) unshielding said device substrate by opening said shutter; and (f) depositing on atleast a selected portion of said device substrate said conductive metal at said low temperature and pressure in said oxygen-free environment, whereby is formed on said atleast a selected portion of said device substrate a conductive metal contact free of an oxide layer.

2. The method as recited in claim 1 wherein said metal is selected from the group consisting of platinum, palladium, nickel, rhodium, zirconium, hafnium, aluminum, tantalum, titanium, tungsten and titanium-tungsten.

3. The method as recited in claim 2 wherein said device substrate exhibits $N^-$ type conductivity and said contact is a Schottky barrier diode contact.

4. The method as recited in claim 2 wherein said contact is an ohmic contact.

5. The method as recited in claim 2 wherein said deposition steps are accomplished by E-beam evaporation.

6. The method as recited in claim 2 wherein said deposition steps are accomplished by high frequency cathode sputtering.

7. The method as recited in claim 5 or 6 wherein prior to placing said blank substrate in said chamber cleaning said blank substrate surface in a diluted hydrofluoric acid solution.

8. The method as recited in claim 5 or 6 wherein said predetermined low pressure is in the range $2.5 \times 10^{-6} - 4 \times 10^{-7}$ torr.

9. The method as recited in claim 8 wherein said metal depositing on said blank substrate is accomplished for about 30 seconds.

10. A low temperature method of forming silicon dioxide-free metal silicide connecting contact on a semiconductor silicon substrate having integrated circuit structures thereon, said method comprising:

placing a semiconductor silicon substrate having integrated circuit structures which are covered with a mask having contact windows (device substrate) and atleast one clean, blank silicon substrate in a deposition chamber maintained at a predetermined low pressure;

heating said substrates to a low temperature in the range of 330° C. to 550° C.;

shielding said device substrate by a substrate shield arranged in close proximity to said device substrate;

depositing a metal on said atleast one blank substrate at said low temperature and pressure for a short period to remove any traces of oxygen in said chamber by chemisorption of said oxygen by said atleast one blank substrate and thereby establishing an oxygen-free environment in said chamber; exposing said device substrate by removing said substrate shield;

depositing in said contact windows of said device substrate said metal at said low temperature and pressure in said oxygen-free environment; and sintering said device substrate at a sufficient temperature and time in a suitable ambient to convert said metal in said contact windows to corresponding metal silicide.

11. The method as recited in claim 10 wherein said short period is about 30 seconds.

12. A low temperature method for forming a silicon dioxide-free platinum silicide contact on a semiconductor wafer having integrated circuit structures, said method comprising:

placing a silicon wafer having integrated circuit structures (device wafer) and atleast one clean, blank silicon wafer in a deposition chamber maintained at a low pressure; heating said wafers simultaneously to a low temperature in the range of 330° C.-550° C.;

shielding said device wafer by means of a shutter arranged in close proximity to said device wafer;

depositing platinum metal on said at least one blank wafer at said low temperature and pressure for a period of about 30 seconds to remove any traces of oxygen present in said chamber by chemisorption of said oxygen traces by said atleast one blank wafer as the platinum is deposited and thereby establishing an oxygen-free environment in said chamber;

exposing said wafer substrate by removing said shutter; depositing on at least a selected portion of said device wafer said platinum at said low temperature and pressure in said oxygen-free environment; and sintering said device wafer at a sufficient temperature and time in a suitable ambient to react the deposited platinum with the silicon thereunder forming platinum silicide contact.

* * * * *